United States Patent
Uchida

(10) Patent No.: US 7,743,297 B2
(45) Date of Patent: Jun. 22, 2010

(54) ELECTRONIC CIRCUIT AND INTEGRATED CIRCUIT INCLUDING SCAN TESTING CIRCUIT, AND POWER CONSUMPTION REDUCING METHOD USED FOR INTEGRATED CIRCUIT

(75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 596 days.

(21) Appl. No.: 11/724,224

(22) Filed: Mar. 15, 2007

(65) Prior Publication Data

US 2007/0226560 A1      Sep. 27, 2007

(30) Foreign Application Priority Data

Mar. 17, 2006  (JP)  ............... 2006-075050

(51) Int. Cl.
G01R 31/28  (2006.01)
(52) U.S. Cl. ............ 714/726; 714/727
(58) Field of Classification Search ........ None
See application file for complete search history.

(56) References Cited

U.S. PATENT DOCUMENTS

| | | | | |
|---|---|---|---|---|
| 5,887,004 | A * | 3/1999 | Walther ............. | 714/726 |
| 2002/0162037 | A1 * | 10/2002 | Woods et al. ......... | 713/322 |
| 2004/0088630 | A1 * | 5/2004 | Arima et al. ......... | 714/744 |
| 2004/0243896 | A1 * | 12/2004 | Jaber et al. .......... | 714/726 |
| 2008/0010573 | A1 * | 1/2008 | Sul ................. | 714/731 |
| 2008/0115024 | A1 * | 5/2008 | Wang et al. .......... | 714/731 |

FOREIGN PATENT DOCUMENTS

| | | |
|---|---|---|
| JP | 1-237474 | 9/1989 |
| JP | 5-075401 | 3/1993 |
| JP | 10-207921 | 8/1998 |
| JP | 2000-180510 | 6/2000 |
| JP | 2001-201542 | 7/2001 |
| JP | 2002-357636 | 12/2002 |
| JP | 2004-536487 | 12/2004 |
| JP | 2005-121544 | 5/2005 |

OTHER PUBLICATIONS

Low-Power Scan Design Using First-Level Supply Gating, Swarup Bhunia, Hamid Mahmoodi, Debjyoti Ghosh, Saibal Mukhopadhyay, and Kaushik Roy, Mar. 2005, vol. 13.*
Japanese Patent Office issued a Japanese Office Action dated Nov. 4, 2009, Application No. 2006-075050.

* cited by examiner

*Primary Examiner*—Kevin L Ellis
*Assistant Examiner*—Guerrier Merant
(74) *Attorney, Agent, or Firm*—Young & Thompson

(57) ABSTRACT

An integrated circuit with a scan testing circuit which enables reducing power consumption in normal operation mode is provided. A power-supply controller applies a power-supply voltage to internal and external transmission circuits in scan test mode and stops applying the power supply voltage in normal operation mode. Thus, power consumption associated with operations of the internal and external transmission circuits is eliminated, thereby reducing power consumption in normal operation mode.

4 Claims, 6 Drawing Sheets

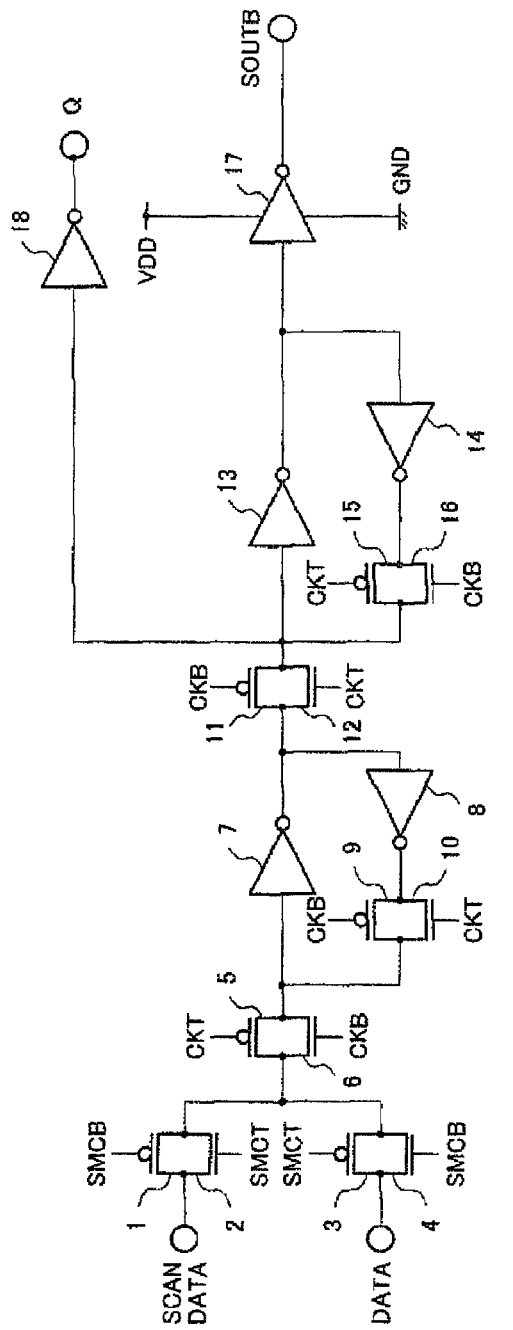
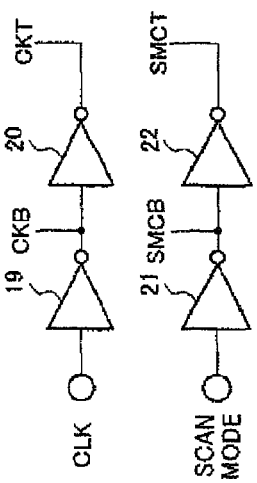
FIG.3A Prior Art
FIG.3B Prior Art
FIG.3C Prior Art
FIG.3D Prior Art

ELECTRONIC CIRCUIT AND INTEGRATED CIRCUIT INCLUDING SCAN TESTING CIRCUIT, AND POWER CONSUMPTION REDUCING METHOD USED FOR INTEGRATED CIRCUIT

BACKGROUND OF THE INVENTION

1. Field of the Invention

The present invention relates to an electronic circuit and an integrated circuit including a scan testing circuit, and a power consumption reducing method used for the integrated circuit and, in particular, to an electronic circuit and an integrated circuit including a scan testing circuit that are capable of reducing power consumption in normal operation mode other than in scan testing mode, and a power consumption reducing method used for the integrated circuit.

2. Description of the Related Art

LSIs (Large Sale Integrated circuits) comprising multiple flip-flops (FFs) also have an embedded circuit for a scan being carried out as an operation test of the LSIs at manufacturing time. These LSIs are called scan-testable integrated circuits. In scan-based testing, each of the FFs of the LSI enters scan test mode in which the FFs are chained together into a shift register called a scan chain. A test input signal is input to the first-stage FF of the scan chain and a test result signal is output from the last-stage FF. The test result signal output from the last-stage FF is compared with a predetermined expected signal in a scan test device. If they do not match, some of the FFs scan-tested supposed to be faulty and the LSIs should be rejected.

FIGS. 3A to 3C show such a conventional LSI for example. The LSI in these figures has a p-channel MOSFET (Metal Oxide-Semiconductor Field-Effect Transistor, herein after referred to as a "pMOS") 1, an n-channel MOSFET (hereinafter referred to as an "nMOS") 2, a pMOS 3, an nMOS 4, a pMOS 5, an nMOS 6, inverters 7 and 8, a pMOS 9, an nMOS 10, a pMOS 11, an nMOS 12, inverters 13 and 14, a pMOS 15, an nMOS 16, and inverters 17 and 18 as shown in FIG. 3A, and inverters 19 and 20 shown in FIG. 3B, and inverters 21 and 22 shown in FIG. 3C. These elements constitute a scan FF. The whole LSI includes a plurality of FFs, not shown, similar to the scan FFs described above. As shown in the table in FIG. 3D, the LSI enters scan test mode when "1" is input as a mode setting signal (SCANMODE) which is input in SCANMODE terminal shown in FIG. 3C. FIG. 4 shows an operation of the conventional circuit shown in FIG. 3A to 3C. As shown in FIGS. 3D and 4, a scan output signal SCNOutPin (SOUTB) alternately changes in accordance with an input signal. When another mode setting signal (SCANMODE) "0" is input, the LSI switches to normal operation mode. Also in normal operation mode, the scan output signal SOUTB alternately changes in accordance with an input signal, same as in scan test mode.

Referring to FIGS. 3A to 3C, the operation will be described in detail. When the mode setting signal SCN-MODE "1" is input, the LSI enters scan test mode. Because input to SCANMODE is "1", a control signal SMCB becomes "0" and another control signal SMCT becomes "1" in the circuit shown in FIG. 3C. As a result, the pMOS 1 and nMOS 2 in the circuit shown in FIG. 3A turn on and the pMOS 3 and nMOS 4 turn off. Since the pMOS 3 and nMOS 4 turn off, a DATA signal is not input in the pMOS 5 and nMOS 6. On the other hand, because the pMOS 1 and nMOS 2 turn on, a SCANDATA signal output from the preceding FF, not shown, is input in pMOS 5 and nMOS 6. The pMOS 5 and nMOS 6 turn on at the trailing edge of a clock CLK and the SCANDATA signal is input in the inverter 7.

At the leading edge of the clock CLK, the pMOS 5 and nMOS 6 turn off and the pMOS 9 and nMOS 10 turn on, and thus a master latch composed of inverters 7 and 8 holds the SCANDATA signal. Since pMOS 11 and nMOS 12 are in the on state, the held SCANDATA is input in the inverter 13 and is also output as a normal operation output signal Q to the outside through the inverter 18. At the trailing edge of the clock CLK, the pMOS 11 and nMOS 12 turn off and the pMOS 15 and nMOS 16 turn on, and thus a slave latch composed of the inverters 13 and 14 holds the SCANDATA. The held SCANDATA is output as a scan output signal SOUTB through the inverter 17 and is provided to the subsequent FF, not shown.

When "0" is input in SCANMODE, the LSI enters normal operation mode. Since the input into SCANMODE is "0", the control signal SMCB in the circuit shown FIG. 3C becomes "1" and the control signal SMCT becomes "0". As a result, the pMOS 1 and nMOS 2 in the circuit shown in FIG. 3A turn off and the pMOS3 and nMOS 4 turn on. Since the pMOS 3 and nMOS 4 are on, the normal operation data "DATA" is input in the subsequent-stage circuit through the pMOS 3 and nMOS4. Thus, the DATA signal is input in place of the SCANDATA signal and subsequently the LSI operates as in scan test mode.

There is a strong demand for reduction of power consumption in LSIs in these years. However, there is a problem with LSIs including a scan testing circuit that the scan testing circuit also operates during normal operation and thus wastes power. More specifically, the scan output signal SOUTB for example is output from the inverter 17 in the LSI described above and shown in FIG. 3A to 3C in normal operation mode as well and therefore power is wasted. To solve the problem, LSIs that deactivate hardware components that are not needed in normal operation mode have been proposed.

For example, there are techniques described in the following documents.

Japanese Patent Laid-Open No. 2001-201542 proposes a technique for reducing power consumption in a scan flip-flop circuit. FIG. 5 shows FIG. 1 of Japanese Patent Laid-Open No. 2001-201542. In the scan flip-flop described in Japanese Patent Laid-Open No. 2001-201542, when an active mode "1" is input as a test enable signal to the circuit shown in FIG. 5 and the circuit enters in scan test mode, a NAND circuit outputs a scan output signal that depends on an input signal. When a non-active mode "0" is input as the test enable signal to the circuit and the circuit enters in normal operation mode, the scan output signal is fixed to "1" regardless of an input signal. Thus, power consumption brought by variations of the scan output signal in normal operation is reduced.

National Publication of International Patent Application No. 2004-536487, which is the published Japanese translation of PCT international publication for International Publication No. WO2002/080368, proposes a technique for reducing power consumption in a buffer circuit. FIGS. 6A and 6B show FIG. 4 of the National Publication of International Patent Application No. 2004-536487. The buffer circuit described in National Publication of International Patent Application No. 2004-536487 has first and second inverters interconnected in series. A pMOS transistor is connected between the first inverter and a power supply potential and an nMOS transistor is connected between the second inverter and a ground potential. The pMos and the nMOS transistors are turned on through a memory cell when the buffer circuit is in use. When the buffer circuit is not in use, they are turned off through the memory cell.

However, these conventional techniques have the following problems.

The technique described in Japanese Patent Laid-Open No. 2001-201542 requires a full-set NAND gate which fixes the scan output signal. Power consumption for driving a full-set gate scale circuit is not small. A NAND gate also consumes not small power and requires current for driving such as operation current and standby current.

The buffer circuit described in National Publication of International Patent Application No. 2004-536487 is intended for reduction of leakage current in a static CMOS circuit. Transistors are added to the buffer circuit and are controlled by using a memory cell. That is, the technique described in National Publication of International Patent Application No. 2004-536487 suites in the buffer circuit because it requires a memory cell. Because of the same reason, the technique does not suite for reducing power consumption of flip-flop with scan testing circuit.

The present invention has been made in view of these circumstances and an object of the present invention is to provide an electronic circuit and an integrated circuit including a scan testing circuit that reduce power consumption in normal operation mode and a power consumption reducing method used for the integrated circuit.

SUMMARY OF THE INVENTION

In an integrated circuit including scan flip-flops and a scan testing capability according to the present invention, a power-supply controller applies a power-supply voltage to internal and external transmission circuits in scan test mode and stops applying the power supply voltage in normal operation mode. Thus, power consumption associated with operations of the internal and external transmission circuits is eliminated, thereby reducing power consumption in normal operation mode.

A signal transmission stopping device stops transmission of a signal through the internal and external circuits in normal operation mode. This prevents power consumption associated with signal transmission, thus reducing power consumption in normal operation mode.

The term "internal transmission circuit" as used herein refers to a circuit for transmitting scan data from one flip-flop to the subsequent flip-flop in a scan chain of flip-flops. The term "external circuit" refers to a circuit that outputs scan data from the last-stage flip-flop of a scan chain to the outside of the scan chain.

BRIEF DESCRIPTION OF THE DRAWINGS

The above and other objects, features and advantages of the present invention will become more apparent from the following detailed description when taken in conjunction with the accompanying drawings wherein:

FIGS. 3A to 3D are circuit diagrams illustrating a conventional circuit to be compared with the embodiment shown in FIGS. 1A to 1D;

Figures 1A, 1B, 1C, 1D:
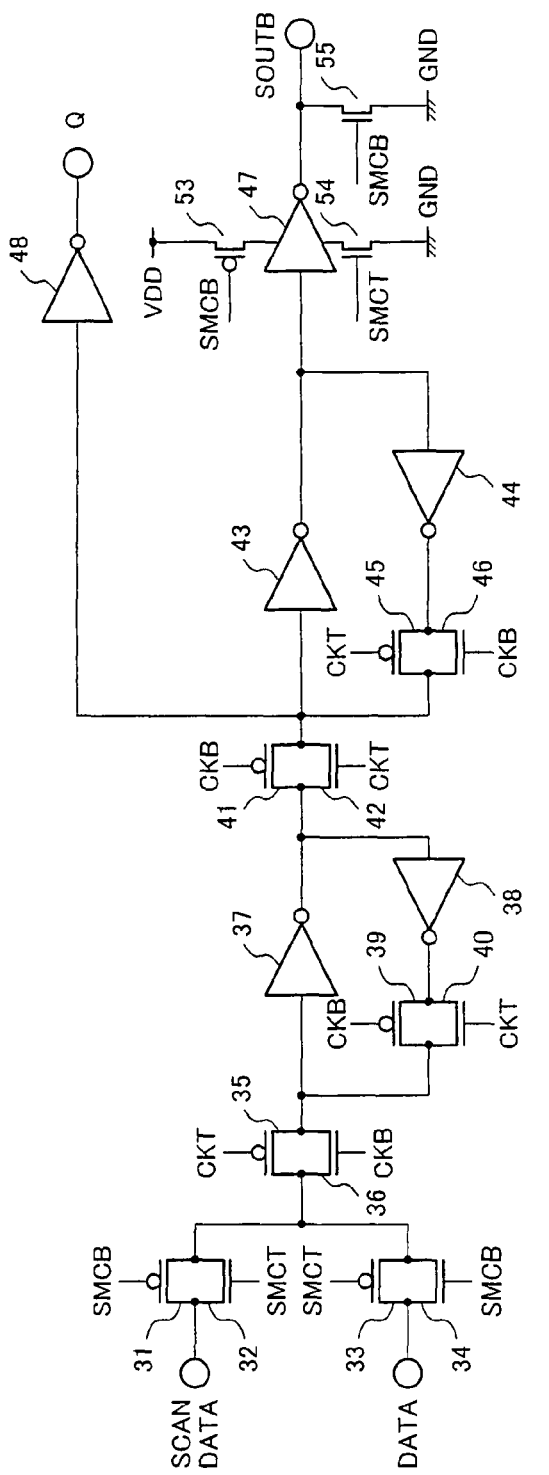
FIGS. 1A to 1D are circuit diagrams illustrating an embodiment of the present invention.

DETAILED DESCRIPTION OF THE EXEMPLARY EMBODIMENTS:

FIGS. 1A to 1C are a circuit diagram illustrating an exemplary embodiment of the present invention. The LSI illustrated in FIGS. 1A to 1C are an integrated circuit including a scan testing circuit. FIG. 1A shows the main portion of one of scan-chained FFs. The circuit shown in FIG. 1A includes a pMOS 31, nMOS 32, pMOS 33, nMOS 34, pMOS 35, nMOS 36, inverters 37 and 38, a pMOS 39, nMOS 40, pMOS 41, nMOS 42, inverters 43 and 44, pMOS 45, nMOS 46, inverters 47 and 48, pMOS 53, and nMOSs 54 and 55. FIG. 1B shows a circuit which consists of inverters 49 and 50 and relates to a CLK signal. FIG. 1C shows a circuit which consists of inverters 51 and 52 and relates to a SCANMODE signal. The elements shown in FIGS. 1A to 1C constitute an FF. The LSI also includes multiple scan-chained FFs, not shown, each having the same configuration that is described above.

The pMOS 31 is turned on and off by a control signal SMCB which is a mode setting signal SCANMODE inverted by the inverter 51. The nMOS 32 is turned on and off by a control signal SMCT which is the control signal SMCB inverted by the inverter 52. The pMOS 33 is turned on and off by the control signal SMCT. The nMOS 34 is turned on and off by the control signal SMCB. The nMOS 36 is turned on and off by a clock CKB which is a clock CLK inverted by the inverter 49. The pMOS 35 is turned on and off by the clock CLK which is the clock CKT inverted by the inverter 50. The pMOS 39 is turned on and off by the clock CKB. The nMOS 40 is turned on and off by the clock CKT. The inverters 37 and 38 form a master latch that holds input data when the pMOS 35 and the nMOS 36 are in the off state and the pMOS 39 and the nMOS 40 are in the on state.

The pMOS 41 is turned on and off by the clock CKB. The nMOS 42 is turned on and off by the clock CKT. The pMOS 45 is turned on and off by the clock CKT. The nMOS 46 is turned on and off by the clock CKB. The inverters 43 and 44 together form a slave latch that holds input data when the pMOS 41 and the nMOS 42 are in the off state and the pMOS 45 and the nMOS 46 are in the on state.

The inverter 47 inverts a signal output from the inverter 43 and outputs it as a scan output signal SOUTB. The inverter 48 inverts an input signal of the inverter 43 and outputs it as a normal output signal Q. The inverter 49 inverts the clock CLK and outputs it as the clock CKB. The inverter 50 inverts the clock CKB and outputs it as the clock CKT. The inverter 51 inverts the mode setting signal SCANMODE and outputs it as the control signal SMCB. The inverter 52 inverts the control signal SMCB and outputs it as the control signal SMCT.

The pMOS 53 is turned on and off by the control signal SMCB. Since the control signal SMCB is the inversion of the mode setting signal SCANMODE, the pMOS 53 is turned on in scan test mode and applies a power-supply voltage VDD to the positive power input terminal of the inverter 47. In normal operation mode, the pMOS 53 is turned off and stops applying the power-supply voltage VDD to the positive power supply input terminal of the inverter 47.

The nMOS 54 is turned on and off by the control signal SMCT. Since the control signal SMCT is the inversion of the control signal SMCB, the nMOS 54 is turned on in scan test mode and couples a ground level (GND) to the negative power supply input terminal of the inverter 47. In normal operation mode, the nMOS 54 is turned off and decouples the negative power supply input terminal of the inverter 47 from the ground level (GND).

The nMOS 55 is turned on and off by the control signal SMCB. In normal operation mode, the nMOS 55 is turned on and stops transmission of an output signal from the output of the inverter 47 to the subsequent FF or a scan test device, not shown. In scan test mode, the nMOS 55 is turned off and transmits the output signal.

The scan output signal SOUTB is output from the inverter 47 and transmitted to the subsequent circuit, not shown, in the scan chain. That is, the circuit from the inverter 47 to the input of the subsequent circuit is an internal transmission circuit in the scan chain. If the circuit shown in FIG. 1A is the last stage in the scan chain, the scan output signal SOUTB is output from the inverter 47 to the outside of the scan chain (for example to a scan test device). That is, the circuit subsequent to the inverter 47 is an external transmission circuit in that case.

When a mode setting signal SCANMODE "1" is input as shown in FIG. 1D, the LSI enters scan test mode in which the scan output signal SOUTB varies in accordance with input of a SCANDATA signal. When mode setting signal SCNMODE "0" is input, the LSI enters normal operation mode in which the scan output signal SOUTB is fixed at "0" output.

Figure 2:
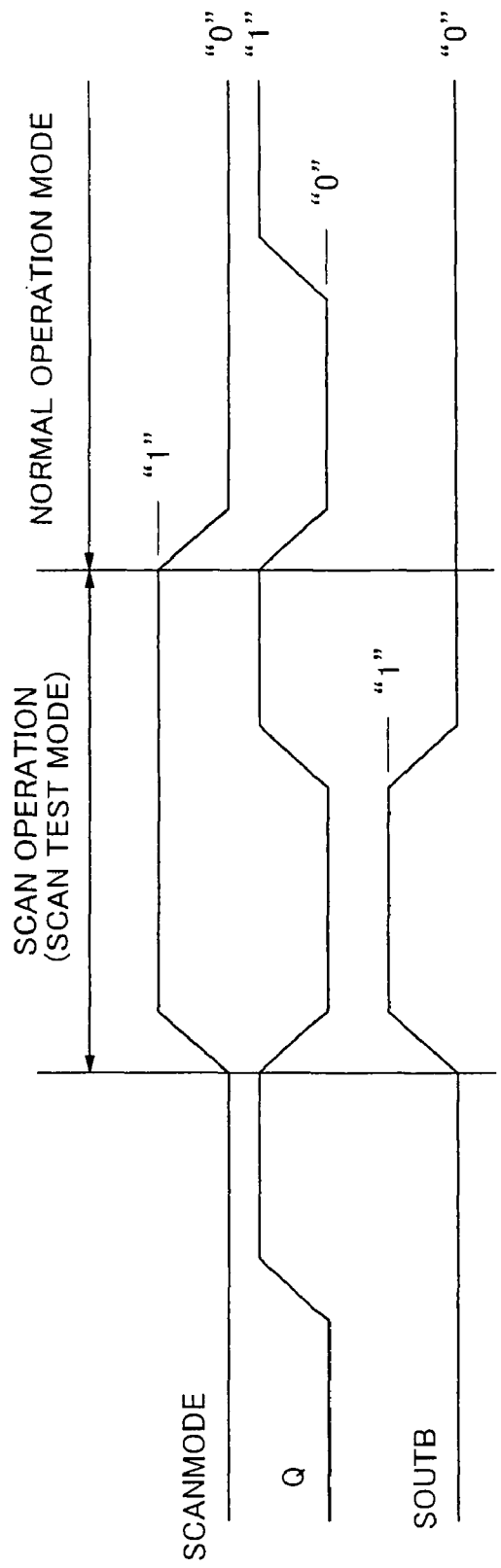
FIG. 2 is a timing chart illustrating an operation of the circuit shown in FIGS. 1A to 1D.
Figure 4:
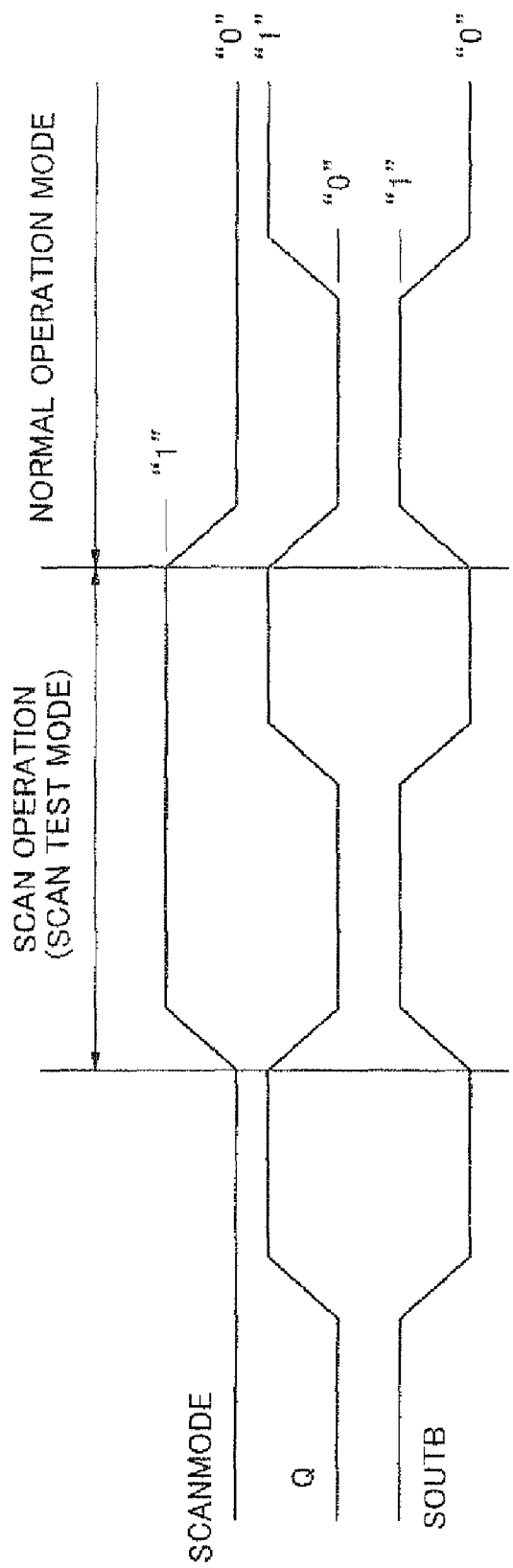
FIG. 4 is a timing chart illustrating an operation of the circuit shown in FIGS. 3A to 3D.
Figure 5:
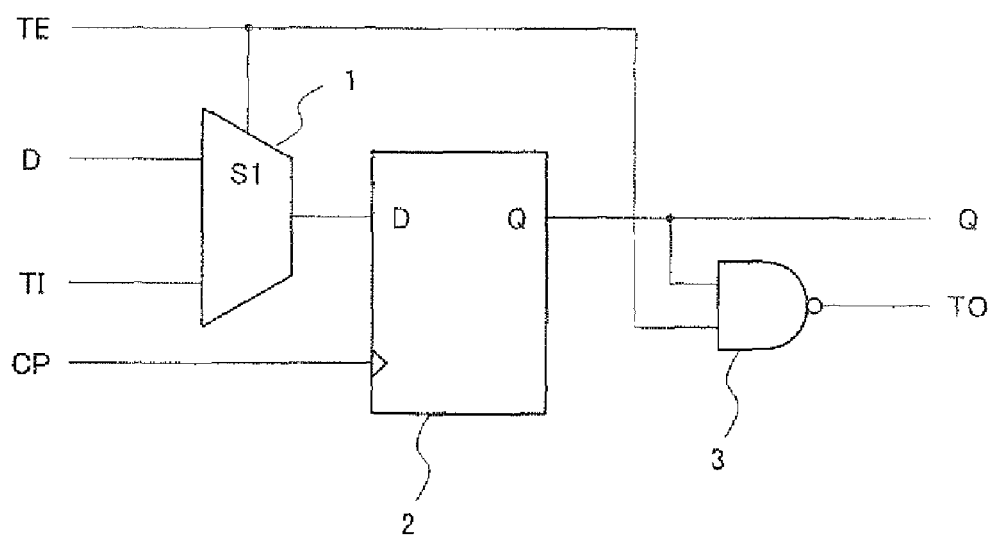
FIG. 5 is FIG. 1 accompanying Japanese Patent Laid-Open No. 2001-201542.
Figure 6A:
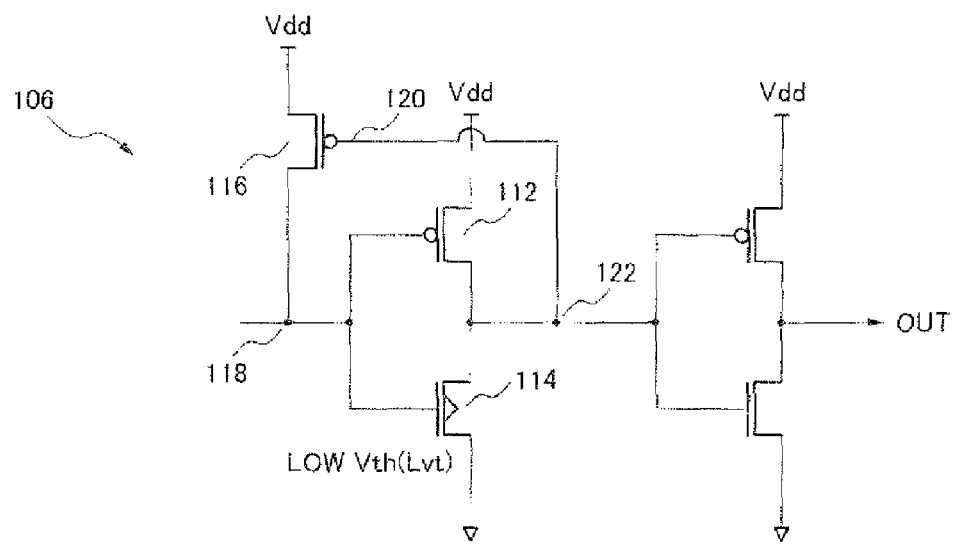
FIGS. 6A and 6B are FIG. 4 accompanying National Publication of International Patent Application No. 2004-536497.
Figure 6B:
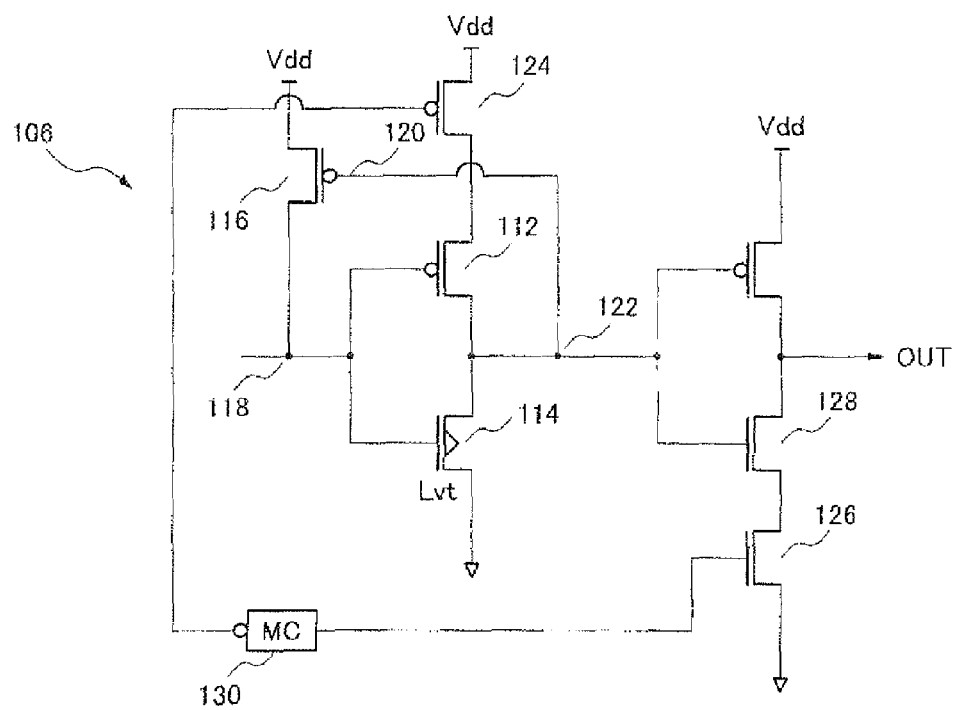

FIG. 2 is a timing chart illustrating an operation of the circuitry shown in FIGS. 1A to 1C. The vertical axis of the timing chart in FIG. 2 represents the logical level and the horizontal axis represents time.

Referring to FIG. 2, an operation relating to reduction of power consumption in the exemplary LSI will be described.

In the LSI, multiple internal FFs are cascaded together for scan testing. In each of the cascaded FFs, a power-supply voltage is applied to the inverter 47 in scan test mode. In normal operation mode, the power-supply voltage is not applied to the inverter 47. Transmission of a signal from the output of the inverter 47 to the subsequent FF or scan test device, not shown, is stopped in normal operation mode.

The operation will be described in detail.

As shown in FIG. 2, when "1" is input to the circuitry as the mode setting signal SCANMODE, the circuitry enters to scan test mode. When "1" is input to SCANMODE, the control signal SMCB in the circuit shown in FIG. 1C becomes "0" and the control signal SMCT becomes "1". As a result, the pMOS 31 and the nMOS 32 in the circuit in FIG. 1A turn on and the pMOS 33 and the nMOS 34 turn off. Consequently, the SCANDATA signal, instead of a DATA signal, is input into the pMOS 35 and the nMOS 36 through the pMOS 31 and the nMOS 32. The input SCANDATA signal is scan data "SCANDATA" (a test signal) that is output from the preceding FF, not shown, for example. The pMOS 35 and the nMOS 36 turn on at the trailing edge of the clock signal CLK and the SCANDATA signal is then input to the inverter 37. At the leading edge of the clock CLK, the pMOS 35 and the nMOS 36 turn off and the pMOS 39 and the nMOS 40 turn on, and consequently the master latch formed by the inverters 37 and 38 holds the SCANDATA. Because the pMOS 41 and the nMOS 42 are in the on state, the held SCANDATA is input into the inverter 43 and is also output as a normal output signal Q to the outside through the inverter 48. At the trailing edge of the clock CLK, the pMOS 41 and the nMOS 42 turn off and the pMOS 45 and the nMOS 46 turn on and consequently the slave latch formed by the inverters 43 and 44 holds the SCAN-DATA. The held SCANDATA is output as a scan output signal SOUTB through the inverter 47 and is transmitted to the subsequent FFs, not shown, in turn. The scan output signal (test result signal) from the last-stage FF is compared with a predetermined expected value in a scan test device. If the test result signal matches the expected value, the FFs pass the scan test; otherwise they fail the scan test and the LSI provided with the faulty FFs will be rejected.

When "0" is input as the mode setting signal SCAN-MODE, the LSI enters normal operation mode. When the input to SCANMODE becomes "0", the control signal SMCB in the circuit shown in FIG. 1C becomes "1" and the control signal SMCT becomes "0". As a result, the pMOS 31 and the nMOS 32 in the circuit in FIG. 1A turn off and the pMOS 33 and the nMOS 34 turn on. Consequently, a DATA signal, instead of the SCANDATA signal, is input to the pMOS 35 and the nMOS 36 through the pMOS 33 and the nMOS 34. The pMOS 35 and the nMOS 36 turn on at the trailing edge of the clock CLK and the DATA signal is input into the inverter 37. At the leading edge of the clock CLK, the pMOS 35 and the nMOS 36 turn off and the pMOS 39 and the nMOS 40 turn on, and the master latch formed by the inverters 37 and 38 holds the DATA.

Because the pMOS 41 and the nMOS 42 are in the on state, the held DATA is input into the inverter 43 and is also output as a normal output signal Q to the outside through the inverter 48. At the trailing edge of the clock CLK, the pMOS 41 and the nMOS 42 turn off and the pMOS 45 and the nMOS 46 turn on, and consequently the slave latch formed by the inverters 43 and 44 holds the "DATA". The held DATA is input into the inverter 47. However, because the pMOS 53 and the nMOS 54 are in the off state and the nMOS 55 is in the on state, no signal is output from the inverter 47 and therefore the scan output signal SOUTB is fixed to "0".

As has been described, the pMOS 53 and the nMOS 54 are turned on to apply the power-supply voltage to the inverter 47 in scan test mode in the exemplary embodiment. In normal operation mode, the pMOS 53 and the nMOS 54 are turned off to stop applying the power-supply voltage to the inverter 47. Also in normal operation mode, the nMOS 55 is turned on to stop transmission of a signal from the output of the inverter 47 to the subsequent FF or scan test device, thus preventing power consumption in the inverter 47 and minimizing power consumption that would caused by signal transmission in the circuits subsequent to the transmitting inverter 47.

While an embodiment of the present invention has been detailed with reference to the accompanying drawings, the present invention is not limited to the specific configuration of the embodiment. Modifications to the design are included in the scope of the present invention without departing from the spirit of the present invention.

For example, while the nMOS 55 is connected between the output of the inverter 47 and the ground in the embodiment described above, the nMOS 55 maybe connected between the output of the inverter 47 and the subsequent flip-flop and may be controlled by using the control signal SMCT. With this configuration, the nMOS 55 is turned off to stop transmission of a signal from the output of the inverter 47 to the subsequent flip-flop in normal operation mode; in the scan test mode, the nMOS 55 is turned on to transmit the signal. In an alternative example, the inverters 47 and 48 may be buffers or may be any logic circuits that transmit an output signal from a slave latch. While a pMOS 53 and an nMOS 54 are provided for each inverter 47 in embodiment described above, a pMOS 53 and an nMOS 54 may serve not for one but for multiple or all inverters 47 disposed in an LSI yet for another example.

While this invention has been described in connection with certain exemplary embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

Further, it is the inventor's intent to retain all equivalents of the claimed invention even if the claims are amended during prosecution.

This application is based on Japanese Patent Application No. JP 2006-075050 filed on Mar. 17, 2006, and including a specification, claims, drawings and summary.

The disclosure of the above Japanese Patent Application is incorporated herein by reference in its entirety.

What is claimed is:

1. An electronic circuit having a scan testing circuit, comprising:
   a flip-flop having a master latch and a slave latch;
   a first transmission circuit which transmits a signal output from the flip-flop as a scan output signal;
   a second transmission circuit which transmits another signal output from the flip-flop as a normal output signal;
   a power-supply controller which applies a power-supply voltage to the first transmission circuit in the scan test mode and stops application of the power-supply voltage to the first transmission circuit in normal operation mode;
   wherein the power-supply controller comprises:
      a first switching transistor which turns ON to apply a first power-supply voltage to one power-supply input of the first transmission circuit in the scan test mode and turns OFF to stop application of the first power-supply voltage to the one power-supply input of the first transmission circuit in a normal operating mode; and
      a second switching transistor which turns ON to apply a first power-supply voltage to the other power-supply input of the first transmission circuit in the scan test mode and turns OFF to stop application of the first power-supply voltage to the other power-supply input of the first transmission circuit in the normal operating mode.

2. The electronic circuit having a scan testing circuit according to claim 1, further comprising a signal transmission stopping device which stops transmission of a signal from the first transmission circuit in the normal operation mode.

3. The electronic circuit having a scan testing circuit according to claim 2, wherein the signal transmission stopping device comprises a third switching transistor which turns ON to stop transmission of a signal from the first transmission circuit in the normal operation mode and turns OFF to transmit the signal in the scan test mode, or turns OFF to stop transmission of a signal from the output of the first transmission circuit in the scan test mode.

4. A method for reducing power consumption of an electronic circuit having a scan testing circuit in which a flip-flop is figured, and a transmission circuit is connected to the flip-flop, when the electronic circuit is switched from a normal operation mode to a scan test mode a test signal is input into the flip-flop, and the test signal output from the flip-flop is transmitted through the transmission circuit in the scan test mode, comprising the step of:
   applying a power-supply voltage to the transmission circuit in the scan test mode using a power supply controller; and
   stopping application of the power-supply voltage to the transmission circuit in the normal operation mode using the power supply controller,
   wherein the power supply controller includes a first switching transistor which turns ON for the applying the power-supply voltage to one power-supply input of the transmission circuit in the scan test mode and turns OFF for the stopping application of the power-supply voltage to the one power-supply input of the transmission circuit in the normal operating mode, and a second switching transistor which turns ON for the applying the power-supply voltage to the other power-supply input of the transmission circuit in the scan test mode and turns OFF for the stopping application of the power-supply voltage to the other power-supply input of the transmission circuit in the normal operating mode.

* * * * *